United States Patent
Manger et al.

(10) Patent No.: US 12,130,557 B2
(45) Date of Patent: Oct. 29, 2024

(54) OPTICAL SYSTEM AND LITHOGRAPHY APPARATUS

(71) Applicant: Carl Zeiss SMT GmbH, Oberkochen (DE)

(72) Inventors: Matthias Manger, Aalen-Unterkochen (DE); Markus Raab, Schillingsfuerst (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/885,353

(22) Filed: Aug. 10, 2022

(65) Prior Publication Data
US 2022/0382166 A1    Dec. 1, 2022

Related U.S. Application Data

(63) Continuation of application No. PCT/EP2021/052954, filed on Feb. 8, 2021.

(30) Foreign Application Priority Data

Feb. 12, 2020   (DE) .......................... 102020201724.7

(51) Int. Cl.
*G03F 7/00* (2006.01)

(52) U.S. Cl.
CPC ...... *G03F 7/70266* (2013.01); *G03F 7/70825* (2013.01); *G03F 7/7085* (2013.01); *G03F 7/70891* (2013.01)

(58) Field of Classification Search
CPC .... G02B 26/0825; G02B 5/0891; G02B 7/00; G02B 7/003; G02B 7/004; G02B 7/008;
(Continued)

(56) References Cited

U.S. PATENT DOCUMENTS

| 7,708,415 B2* | 5/2010 | Griffith | G02B 26/0825 359/846 |
| 8,724,200 B1* | 5/2014 | Wu | G02B 26/0825 359/224.1 |

(Continued)

FOREIGN PATENT DOCUMENTS

| DE | 10 2007 053 226 A1 | 5/2008 |
| DE | 10 2008 049 616 A1 | 4/2010 |

(Continued)

OTHER PUBLICATIONS

Translation of International Search Report for corresponding Appl. No. PCT/EP2021/052954, dated May 25, 2021.
(Continued)

*Primary Examiner* — Deoram Persaud
(74) *Attorney, Agent, or Firm* — Fish & Richardson P.C.

(57) ABSTRACT

An optical system comprises at least one mirror having a mirror body and a mirror surface, and at least one actuator device coupled to the mirror body and serving for deforming the mirror surface. The actuator device comprises at least one electrostrictive actuator element for generating a mechanical stress in the mirror body for deforming the mirror surface depending on an electrical drive voltage, and at least one electrostrictive sensor element for outputting a sensor signal depending on a deformation of the sensor element. The at least one sensor element is arranged directly adjacent to the actuator element and/or is arranged in such a way that it is configured at least partly for transferring the mechanical stress generated by the actuator element to the mirror body.

31 Claims, 9 Drawing Sheets

(58) Field of Classification Search
CPC .......... G02B 7/18; G02B 7/181; G02B 7/182; G02B 26/007; G02B 26/002; G03F 7/70266; G03F 7/70825; G03F 7/7085; G03F 7/70891; G03F 7/70483
See application file for complete search history.

(56) References Cited

U.S. PATENT DOCUMENTS

| | | | | |
|---|---|---|---|---|
| 10,852,643 | B2* | 12/2020 | Juergens | G03F 7/70825 |
| 2002/0048096 | A1* | 4/2002 | Melzer | G02B 26/06 |
| | | | | 359/846 |
| 2006/0050419 | A1* | 3/2006 | Ealey | G02B 26/06 |
| | | | | 359/849 |
| 2007/0263189 | A1 | 11/2007 | Butler et al. | |
| 2010/0202071 | A1* | 8/2010 | Preumont | G02B 26/06 |
| | | | | 359/849 |
| 2011/0235012 | A1 | 9/2011 | Fischer et al. | |
| 2014/0085740 | A1* | 3/2014 | Rooms | G02B 26/06 |
| | | | | 359/846 |
| 2014/0125995 | A1* | 5/2014 | Schoeppach | G03F 7/70266 |
| | | | | 356/601 |
| 2015/0092172 | A1 | 4/2015 | Sai et al. | |
| 2018/0196253 | A1 | 7/2018 | Kwan et al. | |
| 2022/0382165 | A1* | 12/2022 | Raba | H10N 30/50 |

FOREIGN PATENT DOCUMENTS

| | | |
|---|---|---|
| DE | 10 2016 209 847 A1 | 7/2016 |
| DE | 102015223518 A1 | 5/2017 |
| DE | 102018213220 A1 | 9/2019 |
| DE | 102020201724 A1 | 8/2021 |
| JP | 2002-189193 A | 7/2002 |
| JP | 2005-43544 A | 2/2005 |
| JP | 2006-222315 A | 8/2006 |
| JP | 2015-70214 A | 4/2015 |
| JP | 2015-511320 A | 4/2015 |
| JP | 2018-534602 A | 11/2018 |
| WO | WO 2017/050926 A1 | 3/2017 |
| WO | WO 2020/020550 A1 | 1/2020 |

OTHER PUBLICATIONS

Japanese Office Action, with translation thereof, for corresponding JP Appl No. 2022-548749, dated Oct. 17, 2023.
Japanese Office Action, with translation thereof, for corresponding JP Appl No. 2022-548749, dated Apr. 23, 2024.

* cited by examiner

OPTICAL SYSTEM AND LITHOGRAPHY APPARATUS

CROSS-REFERENCE TO RELATED APPLICATIONS

The present application is a continuation of, and claims benefit under 35 USC 120 to, international application PCT/EP2021/052954, filed Feb. 8, 2021, which claims benefit under 35 USC 119 of German Application No. 10 2020 201 724.7, filed Feb. 12, 2020. The entire disclosure of these applications are incorporated by reference herein.

FIELD

The present disclosure relates to an optical system and TO a lithography apparatus having such an optical system.

BACKGROUND

Microlithography is used for producing microstructured components, such as, for example, integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

Mirrors are known whose mirror surface can be deformed in a targeted manner via appropriately arranged actuators. This can allow optical imaging errors, also called aberrations, to be corrected or compensated for. The aberrations can have different origins, for example temperature fluctuations can lead to mechanical stresses which can distort a holder of an optical element and/or an optical element itself, as a result of which optical properties of the optical element in question can change. Such mirrors are used, for example, in astronomy, where the term adaptive optics has become established. Here, the mirror surface is scanned with a measurement light, and a deviation from the ideal shape is determined. It is therefore possible to set up a closed-loop control circuit that drives the corresponding actuators on the basis of the ascertained deviation, whereby the mirror surface is brought closer to its ideal shape.

Mirrors whose surface can be deformed with actuators are also used in lithography apparatuses. However, known lithography apparatuses often have a very small installation space, since many functional units, such as active or passive components, have to be arranged in a small volume. It is therefore typically not practical to arrange an additional optical measurement system in the lithography apparatus in order to scan the mirror surface as explained above. In general, feedback control of the actuators has therefore not been possible to date, or can only be implemented with an effort that is not economically justifiable.

SUMMARY

The present disclosure seeks to make available an improved optical system.

According to a first aspect, an optical system with at least one mirror is proposed. The mirror has a mirror body and a mirror surface. At least one actuator device coupled to the mirror body is provided for deforming the mirror surface. The actuator device comprises at least one electrostrictive actuator element for producing mechanical stress in the mirror body for deforming the mirror surface in dependence on an electrical drive voltage and at least one electrostrictive sensor element for outputting a sensor signal in dependence on a deformation of the sensor element. The at least one sensor element is arranged so as to directly adjoin the actuator element and/or is arranged on a side of the mirror body facing away from the mirror surface and is separated from the mirror body by at least the actuator element and/or is arranged in such a way that it is at least partially is set up to transfer the mechanical stress produced by the actuator element to the mirror body.

This optical system can make it is possible to detect an effect in the mirror body brought about by the actuator element without directly scanning the mirror surface. This can be possible within a physical domain, mechanically or electrically, specifically the coupling between an externally applied electric field and the polarization of the material dependent on the deformation, i.e. without the actuator and sensor being based on different physical mechanisms of action. It could be said that the detection the deformation and the actuation take place with the aid of the same mechanism of action, such as electromechanically via a piezo effect. This can enable a uniform description and treatment of the effects that occur, which can keep the complexity of the optical system low. The optical system can also be produced with a reduced number of different process steps, since the actuator element and the sensor element have the same material class. In addition, the optical system can for this reason be very robust, is producible comparatively cheaply, and is less susceptible to defects.

The optical system is designed for example as a projection optical unit for a lithography apparatus. Furthermore, the optical system can be part of a beam shaping and illumination system of a lithography apparatus. The optical system can also be used in other technical areas in which high-precision beam guidance is used or desired, such as in astronomy, in scientific equipment, or in military optics. Compared to known adaptive optical units, the optical system can be beneficial, for example, when a very limited installation space is available, when a robust system is involved, and/or when costs play a role.

The optical system comprises at least one mirror. In addition to the mirror, the optical system can also have other mirrors, lens elements, gratings, stops, filters, cavities and the like, but it can also consist of the mirror with the actuator device. Furthermore, the optical system can have a plurality of mirrors with a respective actuator device. Further optically effective elements of the optical system can furthermore have additional or other actuators, such as electric heaters, coolers and the like.

The mirror surface of the at least one mirror can have any geometric shape, such as planar, convex, concave, or can vary in sections. The mirror can be arranged at different positions in a beam path within the optical system, for example in the region of a pupil or a hatch. Depending on the position in the beam path, different imaging errors or aberrations can be compensated for by the deformation of the mirror surface. A deformation is understood to mean, for example, a deviation from a basic shape of the mirror surface. For example, the mirror assumes the basic shape when it is arranged stress-free in a holder and orientation intended for operation. The basic shape can deviate here from an ideal shape, for example due to the mirror's own weight, and the ideal shape is restored by the deformation of the mirror surface. A deformation of the mirror surface is preferably understood to mean a deviation from the shape of the mirror surface when the actuator element is free of charge, current and voltage.

The actuator device comprises at least the actuator element and the sensor element. The actuator device can further comprise a drive unit for driving the actuator element with a drive voltage. The drive voltage is predetermined, for example, by a control computer in dependence on the mechanical stress to be achieved. The mechanical stress can directly determine the deformation of the mirror surface, wherein a functional relationship between the mechanical stress and the deformation can be dependent for example on material parameters of the mirror body and on constraints, such as geometric factors. Alternatively, the control computer can specify the mechanical stress to be achieved and the drive unit itself ascertains the drive voltage involved herefor.

The actuator device is coupled to the mirror body of the mirror in such a way that the mirror surface is deformable in dependence on the electrical drive voltage of the actuator element.

The drive unit comprises a voltage or current source, for example. Depending on the application, the actuator element can be operated with closed-loop voltage or charge control. Driving with closed-loop charge control can be advantageous for example in dynamic applications in which the pose of the actuator element is changed with a high frequency.

The actuator element and the sensor element include electrostrictive material, which is also understood to include piezoelectric materials, for example. Electrostrictive materials have the property that, due to an interaction between an external electric field and dipoles present in the material, a mechanical stress or force which manifests as a deformation of the material can be produced in the material. Conversely, a deformation of the material leads to a change in the polarization of the material, which can be measured and allows conclusions to be drawn about the amplitude of the deformation.

It is pointed out that the terms force, mechanical stress and deformation can be used interchangeably.

Examples of the electrostrictive material are ceramic compounds containing the elements lead magnesium niobate (PMN) or lead zirconate titanate (PZT). These can be alloyed with platinum to improve the mechanical properties, wherein the platinum degrades the dielectric properties, for example the maximum polarization. The alloys therefore have a material composition that can be characterized by the alloying factor x: $PMN_x$—$Pt_{1-x}$ or $PZT_xPt_{1-x}$.

In some embodiments of the optical system, the electrostrictive material has a Curie temperature in a range of 0-40° C. At the Curie temperature, a phase transition takes place from a first crystal structure, which prevails below the Curie temperature, to a second crystal structure, which prevails above the Curie temperature.

The actuator element can have an active region, for example a layer, made of the electrostrictive material, which region is arranged between two electrodes, an anode and a cathode. By applying the drive voltage between the anode and the cathode, an electric field can form in the active region, which can lead to the mechanical stress.

The actuator element is mechanically coupled to the mirror body, so that the mechanical stress of the actuator element is transferred to the mirror body, which manifests in a corresponding deformation of the mirror body and therefore the mirror surface. The extent of the deformation achieved with a specific force depends on the strength of the material of the mirror body.

The sensor element can likewise have an active region made of electrostrictive material arranged between two electrodes, for example also a layered structure. However, the sensor element and the actuator element can differ, for example, in terms of their geometric dimensions and/or a material composition.

The sensor element can have an assigned measurement unit, which ascertains the polarization of the active region of the sensor element via a measurement alternating voltage applied between the cathode and the anode of the sensor element. The sensor signal output by the sensor element comprises for example the polarization ascertained by the measurement unit. A deformation of the active region of the sensor element can be derived therefrom. For example, the measurement alternating voltage has an amplitude that does not lead to any mechanical stress worth mentioning in the active region. The measurement unit can constitute an independent unit of the actuator device, wherein the measurement unit and the sensor element are assigned to one another. In the following text, the term sensor element can refer to the sensor element as a whole or only to the active region of the sensor element.

The sensor element is mechanically coupled to the actuator element and/or to the mirror body in such a way that it is deformed when the actuator element deforms and/or when the mirror body is deformed, for example by a mechanical stress that is impressed by the actuator element.

In some embodiments, the sensor element is arranged so as to directly adjoin the actuator element. Directly adjoin is understood to mean, for example, that there is no intermediate layer or no additional material between the actuator element and the sensor element. It may also be said that the sensor element and the actuator element are in contact.

In some embodiments, the sensor element is arranged on a side of the mirror body facing away from the mirror surface and is separated from the mirror body by at least the actuator element. The sensor element can be arranged directly on a rear side of the actuator element, wherein the rear side of the actuator element is the side which points away from the mirror body. It is also possible that there is an additional layer between the actuator element and the sensor element.

In some embodiments, the sensor element is arranged in such a way that it at least partially transfers the mechanical stress produced by the actuator element to the mirror body. It can also be said that the sensor element transfers a force from the actuator element to the mirror body, or it forms an operative connection between the actuator element and the mirror body. For example, the sensor element can be arranged between the actuator element and the mirror body. Alternatively, the sensor element can be embedded in a matrix next to the actuator element, wherein the mechanical coupling between the sensor element, the actuator element and a matrix material is such that mechanical stress propagates, at least substantially, unbroken at the transitions between the actuator element, matrix material and sensor element. In this case, it can also be said that the matrix containing the sensor element and the actuator element appears substantially as a homogeneous body when viewed from the outside.

This arrangement can ensure a strong mechanical coupling between the sensor element and the mirror body and the actuator element, which is why high measurement accuracy can be achieved.

A mechanical coupling between the actuator element, sensor element and mirror body can take place for example through an interlocking connection, such as through a cohesive connection, such as adhesive bonding.

A calibration measurement can be carried out before the optical system is put into operation. In this case, the mirror surface can be illuminated with measurement light, and the actuator device can be made to deform the mirror surface. The deformation of the mirror surface achieved with a specific drive voltage can be determined by the measurement light and a corresponding correlation can thus be established. In addition, if the sensor signal can be detected at the same time, a correlation can also be established between the deformation of the mirror surface and the sensor signal. In some embodiments, the sensor element is only subjected to voltages that are small in absolute value, such that no hysteresis or the like takes place, so that the dielectric properties of the sensor element are constant. By contrast, the properties of the actuator element can change during operation, which can be why precise control based on the correlation between the drive voltage and the deformation achieved during the calibration measurement is hardly possible. The sensor signal can be used during operation to check whether the deformation that is actually achieved corresponds to the desired deformation.

According to some embodiments of the optical system, the latter comprises a closed-loop control unit for controlling the drive voltage for the actuator element in dependence on the sensor signal output by the sensor element such that a predetermined mechanical stress in the mirror body is achieved.

The closed-loop control unit is advantageously set up for controlling the drive voltage in dependence on the sensor signal output by the sensor element. This can be understood to mean that the closed-loop control unit has an evaluation unit, for example, which evaluates the output sensor signal and derives therefrom a mechanical stress that has been achieved. Alternatively, this step can be carried out in a control computer. The closed-loop control unit can be combined with the drive unit, for example.

The closed-loop control unit may be implemented in the form of hardware and/or software. In the case of a hardware implementation, the closed-loop control unit can be designed, for example, as a computer or as a microprocessor. In the case of a software implementation, the closed-loop control unit can be designed as a computer program product, as a function, as a routine, as part of a program code or as an executable object.

Using the actuator device, the mirror surface can be precisely deformed with an actuator element that is subject to closed-loop control. By arranging the sensor element directly on the actuator element and/or on the rear side of the actuator element and/or in the direct path of operation or force path from the actuator element to the mirror body, high accuracy of the closed-loop control can be ensured.

According to some embodiments of the optical system, the at least one actuator element and the at least one sensor element are produced monolithically.

This means for example that the actuator element and the sensor element are made from a material of the same material class, with the same manufacturing technology being used to produce both elements. Furthermore, monolithic means that the actuator and the sensor are based on the same mechanism of operation. The two elements can be produced together, i.e. for example in the same process. This has the advantage that one and the same technology is used for the actuator element and the sensor element, which keeps the complexity of the optical system low.

For example, actuator-sensor arrangements in which the actuation takes place electrically, for example, but the measurement takes place optically, are not monolithic. Also not monolithic is a system in which the actuation takes place electrically via a magnetic field, but the measurement takes place electrically via a capacitance measurement or the like.

According to some embodiments of the optical system, the at least one actuator element and the at least one sensor element are integrated in a layer arranged on the mirror on a side of the mirror body facing away from the mirror surface.

These embodiments can have the advantage that individual actuator elements and individual sensor elements do not have to be arranged on and attached to the mirror body, but rather a layer having integrated therein actuator elements and sensor elements is produced, which is then applied as a whole to the rear side of the mirror, i.e. on the side of the mirror body facing away from the mirror surface. This layer can cover the entire surface of the rear side of the mirror. Alternatively, a plurality of two-dimensional elements from the layer can also be arranged next to one another on the rear side of the mirror. The fact that the at least one actuator element and the at least one sensor element are integrated in the layer should be understood to mean for example that the active regions of the actuator element (the region from which the mechanical stress originates) and of the sensor element (the region whose polarization is detected) are integrated into the layer, wherein other units, such as the measurement unit of the sensor element, are not integrated into the layer.

The layer can consist entirely of the electrostrictive material, wherein the active regions, i.e. actuator subregions and sensor subregions, are formed by arranging electrodes. The rest of the material can be referred to as matrix material or as passive material.

According to some embodiments of the optical system, the at least one sensor element is arranged at least partially between the at least one actuator element and the mirror body in a direction along a surface normal of the mirror surface.

It can also be said that the actuator element and the sensor element partially or completely overlap. Due to this arrangement, the sensor element can be arranged closer to the mirror body and thus to the mirror surface than is the actuator element, which is why the deformation or mechanical stress that can be derived from the sensor signal of the sensor element has a very high correlation with the mechanical stress in the mirror body and thus the deformation of the mirror surface, whereby the closed-loop control becomes more precise.

According to some embodiments of the optical system, the at least one actuator element and the at least one sensor element each comprise at least one layer of electrostrictive material.

A layer is preferably understood here to mean a geometry in which an aspect ratio of thickness to extent, i.e. length or width, is at least 1:5, such as at least 1:10, for example at least 1:100, e.g., up to 1:1000. It is assumed here that the length and width are approximately of the same order of magnitude. For example, the layer has a thickness of between 10 µm and 500 µm and a length and width of 0.5-5 cm each, or is circular with a diameter in the range of 0.5-5 cm.

A layer can have the advantage that the effect achieved, i.e. the mechanical stress or deformation achieved at a specific drive voltage in the plane of the layer, is greater by the factor of the aspect ratio than the effect occurring in the direction perpendicular thereto. An expansion in a first direction due to the electrostrictive effect is, in general, always accompanied by a contraction in a second direction, which is different from the first, due to the incompressibility of the material.

A very thin layer further can have the advantage that high deformations or forces can be achieved even with low drive voltages.

According to some embodiments of the optical system, the at least one actuator element has a plurality of layers made of electrostrictive material, wherein each layer of the plurality has an assigned cathode and an assigned anode and is drivable with a respective drive voltage.

This multilayer structure can have the advantage that a force or mechanical stress that is achievable with the actuator element can be significantly increased as the sum of the force achieved by the individual layers compared to a single layer. Therefore, greater dell) formations are possible, and a correction region in which aberrations can be effectively compensated for is expanded.

In embodiments of the optical system, a cathode enclosed between two layers forms the common cathode of the adjoining layers and an anode enclosed between two layers forms the common anode of the adjoining layers.

In this case, the electric field has an opposite direction in adjacent layers. An advantage of this embodiment can be that the proportion of active material in the actuator element can be maximized since, for example, no insulating separating layer is required between two cathodes or anodes and since the amount of cathode material or anode material is also minimized.

In this embodiment, the electric field has an opposite direction in adjacent layers. Therefore, an electrostrictive material in which the mechanical strain is, in general, proportional to the square of the polarization is advantageously chosen, since the opposite direction of the electric field has no effect here on a force direction.

According to some embodiments of the optical system, the at least one actuator element and the at least one sensor element form a layer stack comprising at least two layers.

In this case, the sensor layer is applied directly to the actuator layer, for example, with a common electrode therebetween. This can allow a particularly compact design to be implemented, and mechanical coupling between the sensor element and actuator element is also maximized. The sensor element can deformed identically to the actuator element, which can be why the drive voltage of the actuator element can be subject to very precise closed-loop control.

According to some embodiments of the optical system, the actuator device has at least two sensor elements, wherein a material composition of the electrostrictive material of the at least two sensor elements differs, with each of the at least two sensor elements being set up to output a sensor signal.

These embodiments can be advantageous since, for example, temperature fluctuations can influence the polarization of the active material, which can lead to measurement errors. In the case of layers with different compositions, temperature fluctuations have different effects, so that the influence of the temperature can be computationally removed. This can make greater reliability and measurement accuracy possible. In this case, due to the small thickness of a layer stack made up of two sensor elements, it can be assumed, for example, that both sensor elements have the same temperature.

According to some embodiments of the optical system, an ascertainment unit is provided, which can be set up to ascertain a temperature in the mirror body in dependence on the sensor signals output by the at least two sensor elements.

By comparing the two sensor signals from the sensor elements having different compositions, both the mechanical stress and the temperature can be ascertained via a corresponding evaluation based on a physical model that describes the underlying physics. This can be particularly advantageous when optimum cooling of the mirror body in the desired region is not possible or is possible only with great effort. The mechanical stresses in the mirror body caused by temperature fluctuations or local temperature differences can then be taken into account when ascertaining the current shape of the mirror surface and/or can be compensated for via the actuator device. This can be advantageously possible without an additional system.

The temperature that is ascertainable in this way can relate to the temperature in the mirror body in the region of the two sensor elements, and is therefore for example a local temperature.

According to some embodiments of the optical system, a measurement unit is provided for applying a measurement alternating voltage to the at least two sensor elements to generate the sensor signal, wherein a frequency of the measurement alternating voltage is different for different sensor elements.

This can have the advantage that crosstalk between different conductor tracks to the sensor elements does not lead to a measurement error during the evaluation. It is also possible to refer to frequency-division multiplexing. The measurement unit can for example be part of the closed-loop control unit or the actuator device, but can also form an independent unit.

According to some embodiments of the optical system, the actuator device has a plurality of M actuator elements and a plurality of N sensor elements, wherein M and N are integers and the actuator elements and the sensor elements are arranged in alternation.

Optionally, N>M, for example N=M1, so that one sensor element is on the outside in each case. For example, N=2 and M=1, with the two sensor elements forming a sandwich structure with the actuator element. A two-dimensional deformation function can advantageously be ascertained here, so that the actual deformation in a section somewhat distant from the actuator element can be ascertained or predicted more precisely, which increases the accuracy of the closed-loop control. It can also be said that due to an over-determination, more precise closed-loop control is possible.

According to some embodiments of the optical system, the actuator device comprises an assignment unit, which is set up to assign a value of the output sensor signal from the at least one sensor element to an achieved deformation of the mirror surface on the basis of a calibration measurement, and wherein the closed-loop control unit is set up for controlling the drive voltage depending on the assigned value and a predetermined deformation of the mirror surface.

In some embodiments, the assignment unit comprises a look-up table (LUT) in which sensor signal values are assigned to an achieved deformation of the mirror surface. These embodiments can be particularly simple and does not require high computing power. Intermediate values, that is to say values for the deformation in the case of values of the sensor signal which are not stored in the LUT, can be ascertained from the two closest values, for example by linear interpolation.

According to some embodiments of the optical system, a plurality of actuator devices is arranged at the at least one mirror, wherein each of the actuator devices of the plurality is individually controllable.

The full area of the mirror can be covered, for example, with actuator devices, with the result that the mirror surface is freely deformable in a variety of ways by appropriate driving of the actuator devices. Each actuator device can advantageously have a closed-loop control unit, with the result that each actuator device can be controlled with closed-loop control independently of the other actuator devices. For example in the case of adjacent actuator devices, a deformation at the location of the first actuator device can also lead to a slight deformation at the location of the second actuator device, since the mechanical stresses propagate throughout the mirror body. This deformation can also be detected by the sensor element of the second actuator device, and the actuator element can be controlled accordingly with closed-loop control in order to counteract the deformation, assuming the latter is not desired anyway.

According to a second aspect, a lithography apparatus having an optical system according to the first aspect or one of the embodiments is proposed.

This lithography apparatus can have the advantage that imaging errors can be corrected or compensated for, wherein a closed-loop control circuit for controlling a respective actuator element is present. This means that the aberrations can be corrected much more precisely than without such a closed-loop control circuit. In lithography apparatuses for example, the installation space is very small, since the optical units used are operated in a vacuum, for example, which is why conventional solutions for adaptive optics cannot be used.

The optical system can form a beam shaping and illumination system or a projection system of a lithography apparatus or is part of such a system.

According to a third aspect, the use of a mirror coupled to an actuator device in an optical system is proposed. The mirror has a mirror body and a mirror surface. The actuator device comprises at least one electrostrictive actuator element for producing mechanical stress in the mirror body for deforming the mirror surface in dependence on an electrical drive voltage and at least one electrostrictive sensor element for outputting a sensor signal in dependence on a deformation of the sensor element. The at least one sensor element is arranged so as to directly adjoin the actuator element and/or is arranged on a side of the mirror body facing away from the mirror surface and is separated from the mirror body by at least the actuator element and/or is arranged in such a way that it is at least partially is set up to transfer the mechanical stress produced by the actuator element to the mirror body. The actuator device is coupled to the mirror body in such a way that the mirror surface is deformed in dependence on the electrical drive voltage.

A fourth aspect proposes a method for operating an optical system with at least one mirror, which has a mirror body and a mirror surface, and with at least one actuator device coupled to the mirror body for deforming the mirror surface. In a first step, an electrostrictive actuator element of the actuator device is driven with an electrical drive voltage, with the result that a mechanical stress is produced in the mirror body and the mirror surface is deformed. In a second step, a sensor signal is detected via at least one electrostrictive sensor element of the actuator device in dependence on a deformation of the sensor element, wherein the at least one sensor element is arranged so as to directly adjoin the actuator element and/or is arranged on a side of the mirror body facing away from the mirror surface facing away from the mirror body and is separated from the mirror body by at least the actuator element and/or is arranged such that it is at least partially set up for transferring the mechanical stress produced by the actuator element to the mirror body. In a third step, the deformation of the mirror surface is ascertained in dependence on the detected sensor signal.

In embodiments, the optical system described above and below is set up to carry out the aforementioned method or to be operated according to the method.

According to a further aspect, a method for detecting an achieved deformation of a mirror surface of an optical system according to the first aspect or one of the embodiments is proposed. In a first step, the at least one actuator element is driven via a drive voltage in dependence on a predetermined deformation of the mirror surface. For example, in a current state of the optical system, a control computer ascertains an ideal shape of the mirror surface that deviates from the current actual shape of the mirror surface and, depending on this, ascertains the involved drive voltage for the actuator element which is output to the actuator unit. In a second step, a sensor signal is output by the at least one sensor element. This is done for example by applying a measurement alternating voltage to the active region of the sensor element. From the complex impedance of the sensor element, the dielectric susceptibility and thus the polarization of the active region can be inferred. In a third step, a deformation of the sensor element is ascertained in dependence on the output sensor signal, and therefrom the achieved deformation of the mirror surface is ascertained. The polarization of the active region of the sensor element is indicative of the existing deformation of the sensor element. From this, the deformation of the mirror surface can be ascertained via a mechanical model of the mirror. The deformation of the mirror surface in dependence on the deformation of the sensor element can be ascertained and stored in a LUT in advance in a calibration measurement.

In embodiments of the method, the drive voltage can be controlled with closed-loop control in such a way that the predetermined deformation of the mirror surface is achieved.

The embodiments and features described for the optical system are correspondingly applicable to the proposed method.

"A(n)" in the present case should not necessarily be understood to be restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the disclosure also comprise not explicitly mentioned combinations of any features or embodiments that are described above or below with respect to the exemplary embodiments. In this case, a person skilled in the art will also add individual aspects as improvements or supplementations to the respective basic form of the disclosure.

Further advantageous configurations and aspects of the disclosure are the subject matter of the dependent claims and also of the working examples of the disclosure described hereinafter. The disclosure is explained in more detail below by way of exemplary embodiments with reference to the appended figures.

DESCRIPTION OF EXEMPLARY EMBODIMENTS

Unless indicated otherwise, elements that are the same or functionally the same have been given the same reference signs in the figures. It should also be noted that the illustrations in the figures are not necessarily true to scale.

Figure 1:
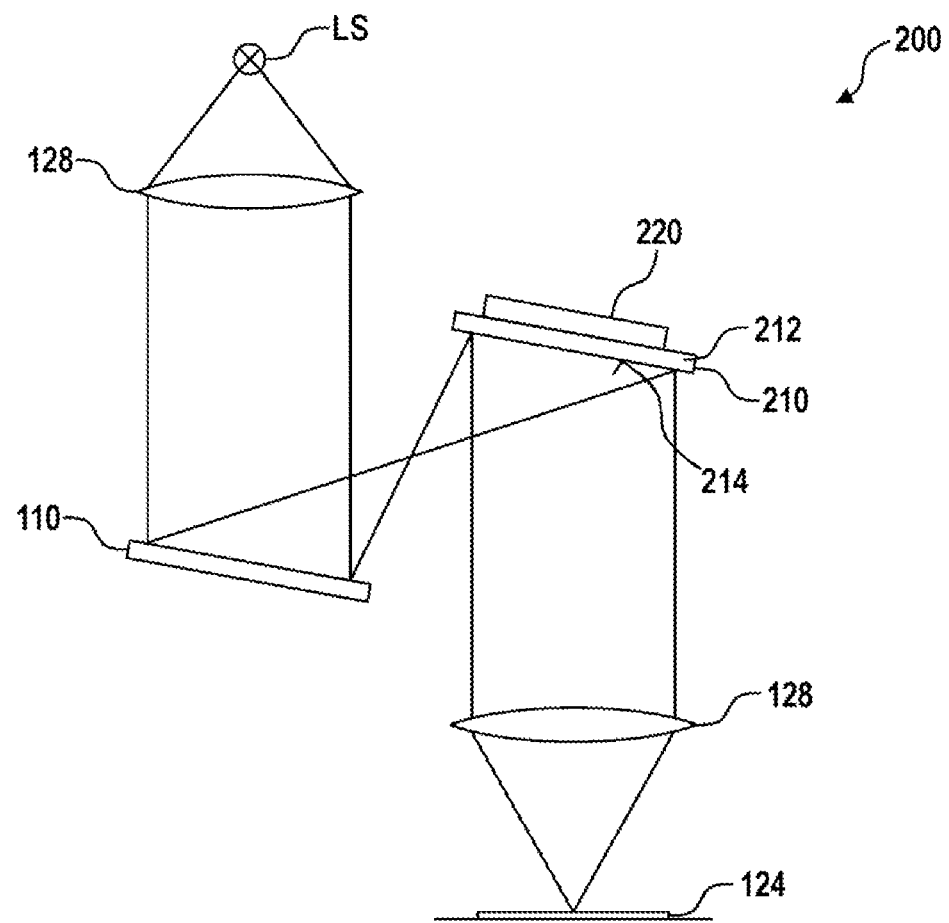
FIG. 1 shows a schematic view of a first exemplary embodiment of an optical system.

FIG. 1 shows a schematic view of a first exemplary embodiment of an optical system 200. The optical system 200 here comprises a light source LS, a lens element 128 which collimates the light incident thereon from the light source LS, two mirrors 110, 210, a further lens element 128 and a wafer 124 or object slide on which the light from the further lens element 128 is focused. For example, the optical system 200 is an illumination system of a microscope or a lithography apparatus 100A, 100B (see FIGS. 14A, 14B).

The second mirror 210 of the optical system 200 comprises a mirror body 212, on the front side of which the mirror surface 214 is arranged. An actuator device 220 is arranged on the rear side of the mirror body 212 and is set up to deform the mirror surface 214 by coupling a mechanical stress into the mirror body 212. Without restricting the generality, only one actuator device 220 is shown here and also in the following figures. However, it goes without saying that a plurality of such actuator devices 220 can be arranged at the mirror 210 in order to deform the mirror surface 214 in a targeted manner with a high spatial resolution and/or to achieve an overall deformation of the mirror 210.

Due to the fact that the mirror surface 214 of the mirror 210 can be deformed, it is possible to compensate for an aberration, i.e. an imaging error. In this case, the imaging error is dependent for example on an operating state of the optical system 200 and/or of further optical systems which are coupled to the optical system 200. For example, spatial and/or temporal temperature differences and/or temperature fluctuations can be compensated for by the actuator device 220. It is therefore also possible to speak of an adaptive optical system 200 whose state is subject to closed-loop control or kept constant in relation to a reference state. The actuator device 220 can comprise a closed-loop control circuit for controlling the actuator element 222 (see FIG. 2-8, 10, 13, 14A or 14B).

The precise mode of operation of the actuator device 220 will be explained in detail with reference to the following figures.

Figure 14A:
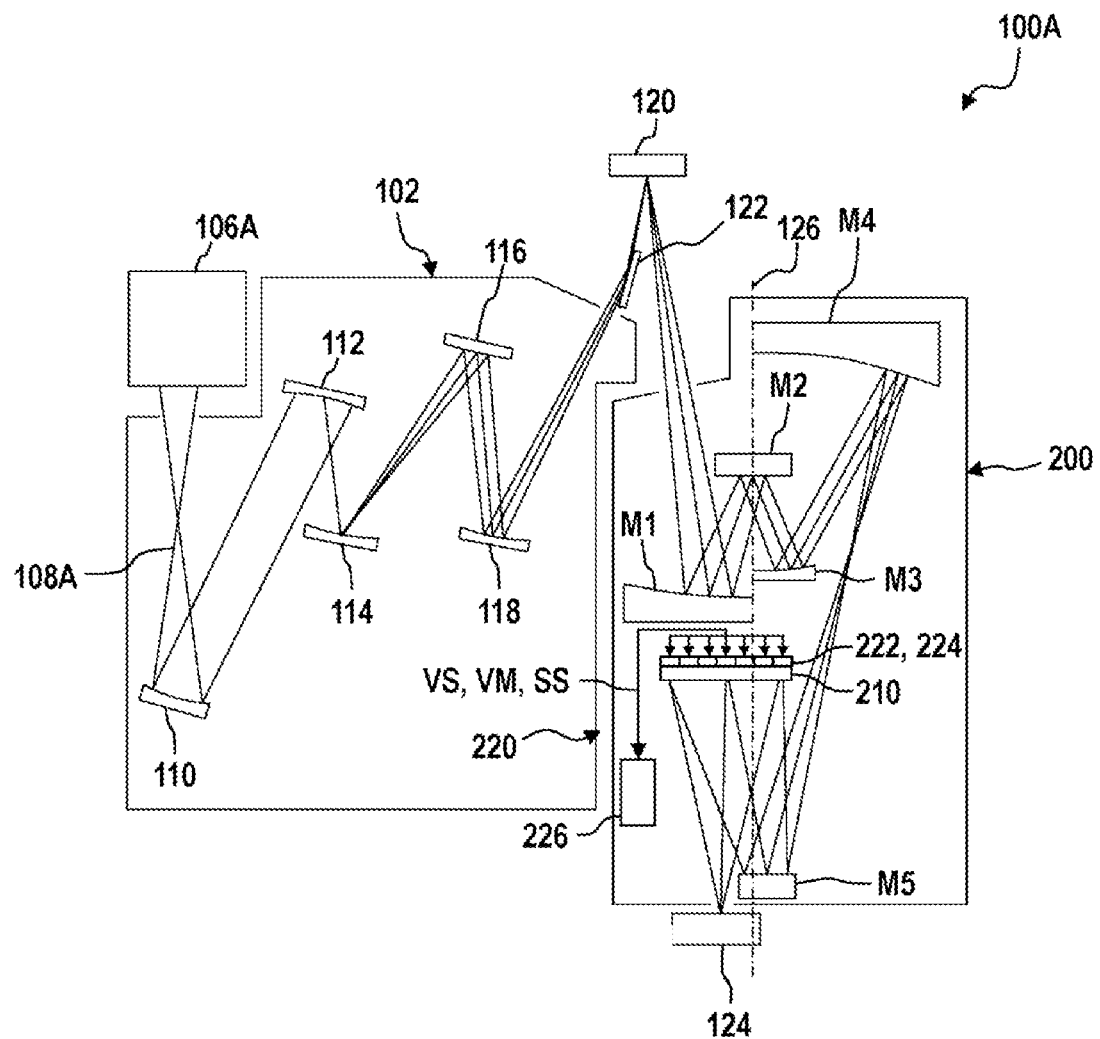
FIG. 14A shows a schematic view of an embodiment of an EUV lithography apparatus.
Figure 14B:
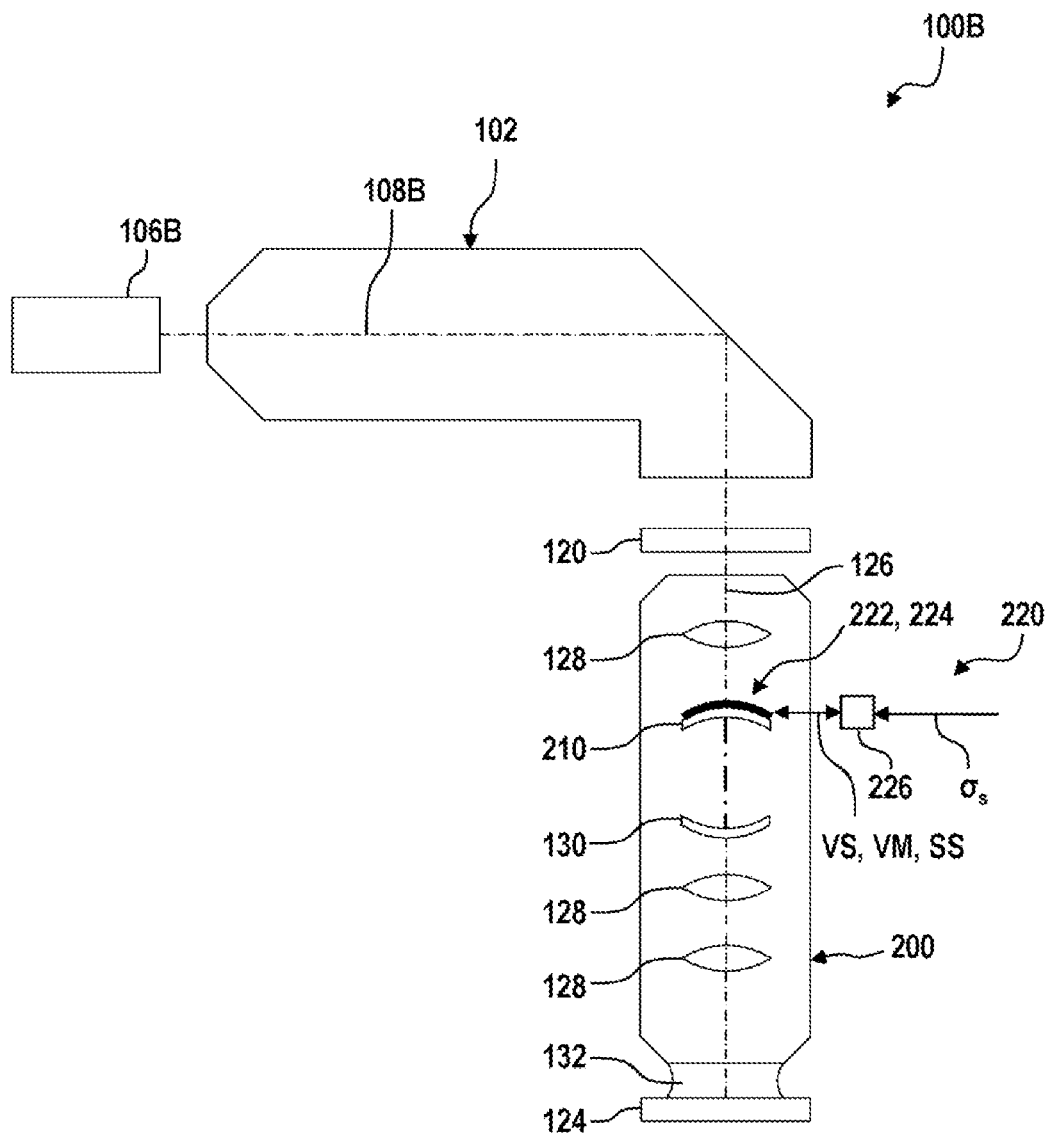
FIG. 14B shows a schematic view of an embodiment of a DUV lithography apparatus.

FIGS. 2-7 each show a schematic view of an exemplary embodiment of an arrangement of a mirror 210 with an actuator device 220. The exemplary embodiments differ in terms of the specific arrangement of the actuator device 220 and mirror 210. Each of the exemplary embodiments may be used in an optical system 200, as shown in FIGS. 1, 14A and 14B.

Figure 2:
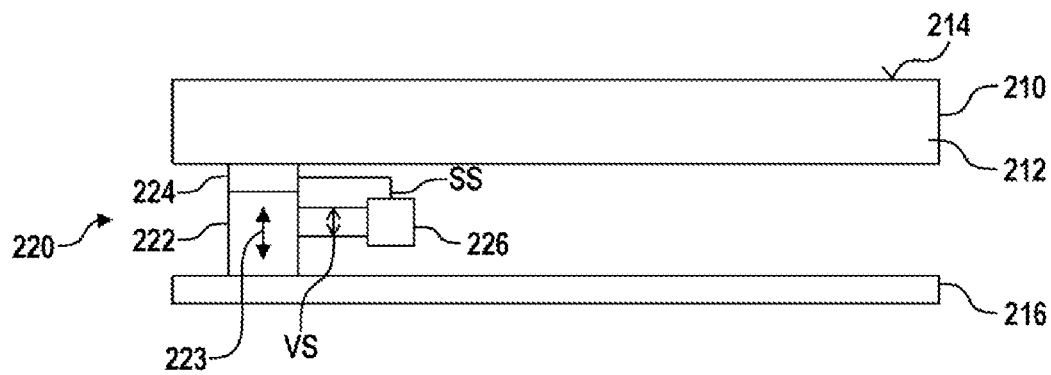
FIG. 2 shows a schematic view of a first exemplary embodiment of an arrangement of a mirror with an actuator device.

FIG. 2 shows an actuator device 220 which is arranged between the mirror body 212 and a mirror carrier 216. The mirror carrier 216 forms a mechanical fixed point, which means it is rigid and fixed. The actuator device 220 has an actuator element 222 and a sensor element 224, wherein the sensor element 224 makes mechanical contact with the mirror body 212 and the actuator element 222 is supported on the mirror carrier 216. Furthermore, a drive unit 226 is present, which provides the drive voltage VS for driving the actuator element 222. In this example, the drive unit 226 also detects the sensor signal SS output by the sensor element 224. The drive unit 226 can be designed as a closed-loop control unit, or comprises one, which controls the drive voltage VS in dependence on the sensor signal SS.

In this arrangement, the actuation direction 223 is parallel to a surface normal of the mirror surface 214. The actuator element 222 stretches or expands in the actuation direction 223 when a drive voltage VS is applied to it. A stretching of the actuator element 222 leads to a bulging or displacement of the mirror surface 214 at the location of the actuator device 220 because the mirror carrier 216 is fixed. It is possible here for the mirror body 212 to be supported on the mirror carrier 216 at one or more points with a fixed connecting element (not shown). Such a fixed connecting element fixes where it is arranged the distance between the mirror body 212 and the mirror carrier 216, for example.

Figure 3:
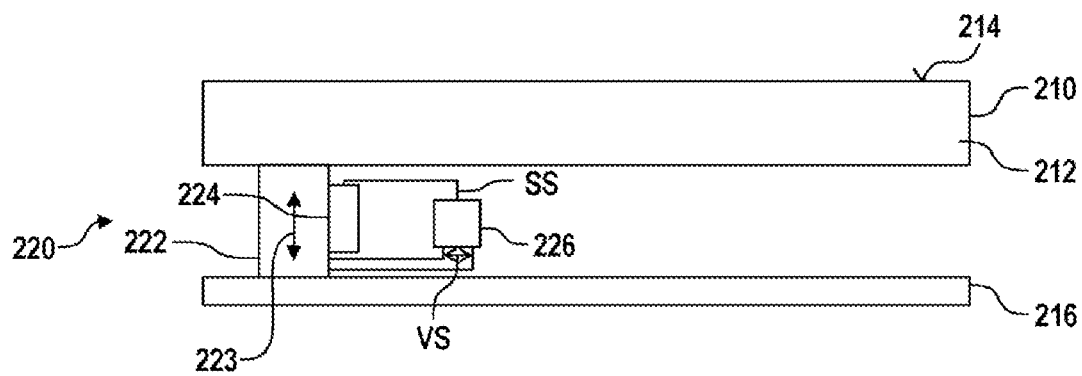
FIG. 3 shows a schematic view of a second exemplary embodiment of an arrangement of a mirror with an actuator device.

FIG. 3 shows an alternative embodiment of an actuator device 220 which is arranged between the mirror body 212 and a mirror carrier 216. In this case, the sensor element 224 is arranged laterally directly on the actuator element 222. In this arrangement, the sensor element 224 will exactly follow any deformation, for example stretching or compression, of the actuator element 222 along the actuation direction 223. The actual deformation of the actuator element 222 can therefore be determined very precisely from the sensor signal SS.

Figure 4:
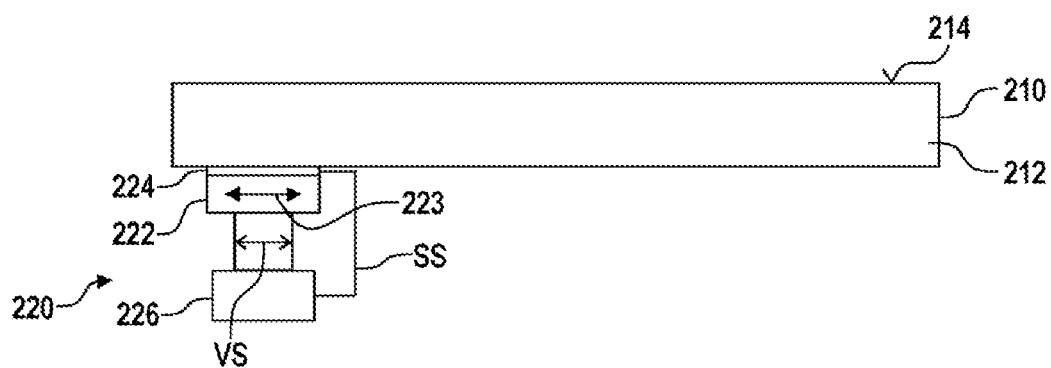
FIG. 4 shows a schematic view of a third exemplary embodiment of an arrangement of a mirror with an actuator device.
Figure 5:
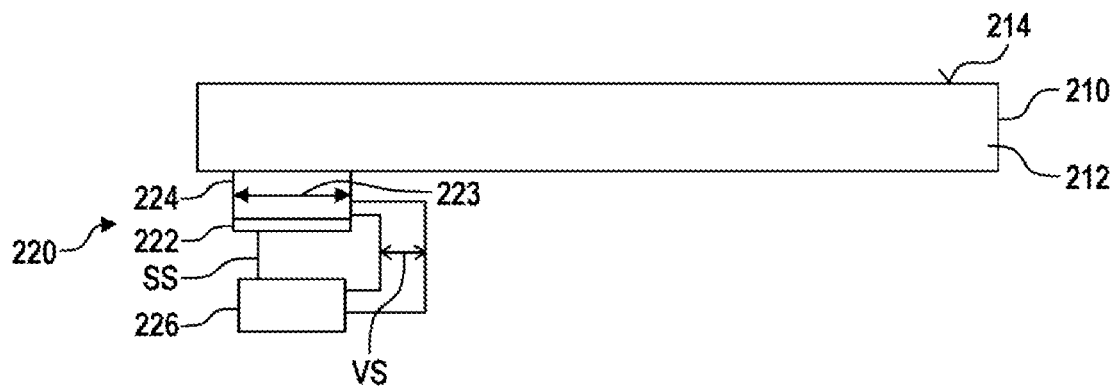
FIG. 5 shows a schematic view of a fourth exemplary embodiment of an arrangement of a mirror with an actuator device.

FIGS. 4 to 7 each show a different integration of the actuator device 220, wherein, in contrast to FIGS. 2 and 3, a transverse actuation direction 223, i.e. in the plane of the mirror body 212, is used. In FIGS. 4 and 5, the actuator device 220 is adhesively bonded to the rear side of the mirror body 212 or is firmly connected thereto in a similar manner. The sensor element 224 is either arranged between the actuator element 222 and the mirror body 212 (FIG. 4) or arranged on the rear side of the actuator element 222 (FIG. 5). In the arrangement shown in FIG. 4, the sensor element 224 transfers any mechanical stress produced by the actuator element 222 to the mirror body 212. For example, the sensor element 224 undergoes the same deformation as the actuator element 222 and the region of the mirror body 212 in direct contact with the sensor element 224. The transverse actuation 223, which can be a stretching or a shortening in relation to the actuator element 222, produces mechanical stress in the mirror body 212, as a result of which the mirror surface 214 is correspondingly deformed.

Figure 6:
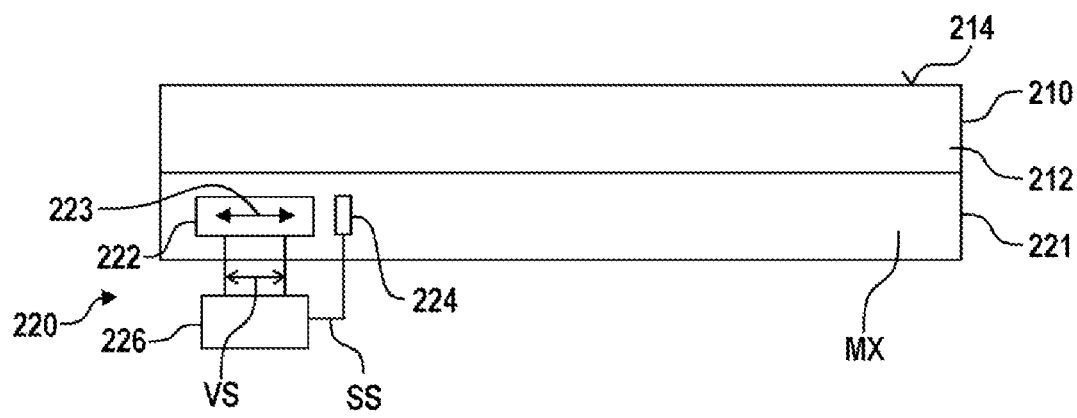
FIG. 6 shows a schematic view of a fifth exemplary embodiment of an arrangement of a mirror with an actuator device.
Figure 7:
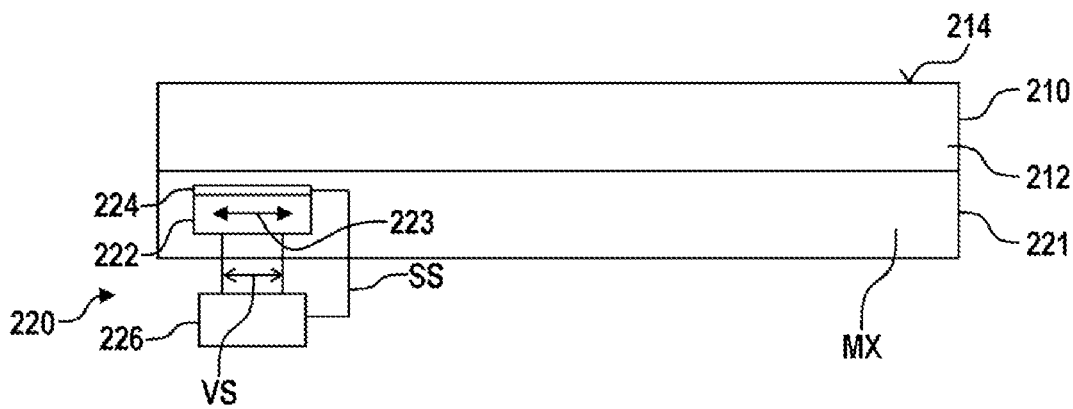
FIG. 7 shows a schematic view of a sixth exemplary embodiment of an arrangement of a mirror with an actuator device.

In the exemplary embodiments in FIGS. 6 and 7, the actuator element 222 and the sensor element 224 are embedded in a matrix MX. The matrix MX comprises for example a material of the same material class as the actuator element 222, and the sensor element 224 can comprise of an electrostrictive ceramic material. Advantageously, the actuator element 222, the sensor element 224 and the matrix MX form a substantially homogeneous material layer 221, which is fixed two-dimensionally to, optionally over the whole area of, the rear side of the mirror body 212. The active regions of the actuator element 222 and the sensor element 224 are defined by the arrangement of electrodes in the material MX. In these embodiments, a mechanical coupling of the actuator element 222 to the mirror body 212 can be particularly strong, which has an advantageous effect on the maximum deformation of the mirror surface 214 that is achievable.

The exemplary embodiments shown in FIGS. 2-7 can also be combined with one another as desired.

Figure 8:
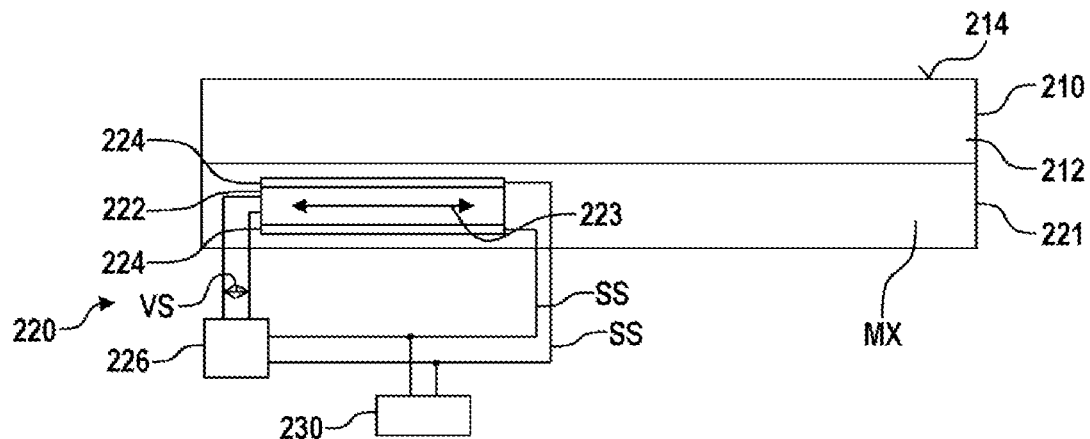
FIG. 8 shows a schematic view of a seventh exemplary embodiment of an arrangement of a mirror with an actuator device having two sensor elements.

FIG. 8 shows a schematic view of a fourth exemplary embodiment of an arrangement of a mirror 210 with an actuator device 220. The basic arrangement corresponds to that shown in FIG. 7, wherein the actuator device 220 here has two sensor elements 224 which enclose the actuator element 222 in the manner of a sandwich. The two sensor elements 224 advantageously have different chemical compositions, which means they have different dependencies on the temperature and the deformation. Then it is possible to ascertain from the two sensor signals SS not only the deformation of the respective sensor element 224 but also the temperature. In the present case, this is done by an ascertainment unit 230 that is especially set up for this purpose.

Figure 9:
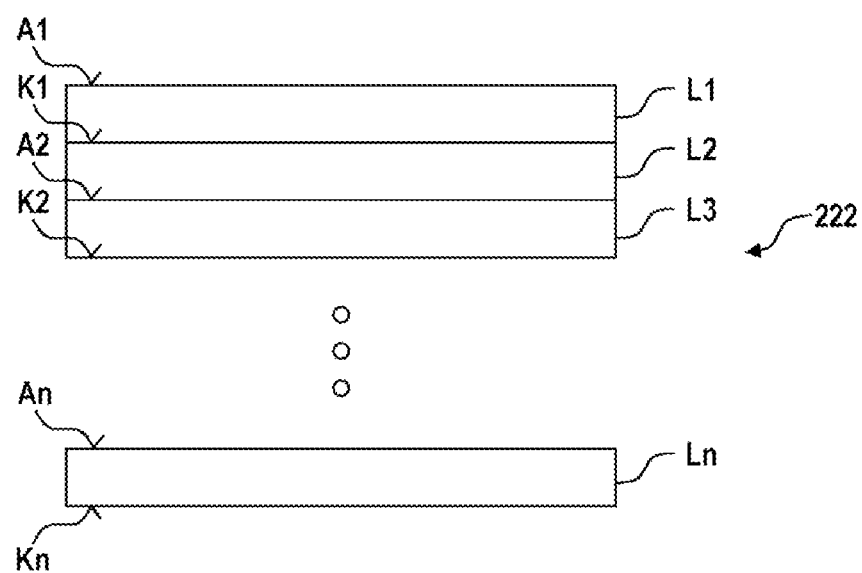
FIG. 9 shows a schematic view of an exemplary embodiment of a construction of an actuator element.

FIG. 9 shows a schematic view of an exemplary embodiment of a construction of an actuator element 222, which here comprises a plurality of individual layers L1-Ln. An electrode A1 is arranged on the uppermost layer L1 and is operated here, for example, as an anode. A further electrode K1, which is operated here as a cathode, is arranged between the uppermost layer L1 and the layer L2 arranged therebelow in an adjoining manner. The anode A1 and the cathode K1 can be said to enclose the top layer L1 in the manner of a sandwich. A drive voltage VS applied between the anode A1 and cathode K1 (see FIG. 2-8 or 10-13) leads to the formation of an electric field in the layer L1. The roles of the anode A1 and the cathode K1 can also be reversed in embodiments, in which case the direction of the electric field is reversed.

An electrode A2, which is operated as an anode, is again arranged between the second layer from the top L2 and the third layer from the top L3. It can be seen here that the cathode K1 forms a common cathode for the adjoining layers L1 and L2. The anode A2 also forms a common anode for the adjoining layers L2 and L3.

In this example, this layered construction is continued until the desired number of layers has been reached. Arranged underneath the bottom layer Ln is a terminating electrode Kn, which in this embodiment operates as a cathode. In this alternating construction with common electrodes A1-An, K1-Kn, the electrostrictive material is for example one in which the mechanical strain is proportional to the square of the polarization, so that the layers L1-Ln, despite different directions of the electric field, produce a deformation in the same direction.

In other embodiments in which an electrostrictive material is used in which the mechanical strain is proportional to the polarization, the electrodes A1-An, K1-Kn should be arranged and driven in such a way that the electric field in all layers L1-Ln points in the same direction, since otherwise the layers L1-Ln work against one another.

A layer thickness of the layers L1-Ln can be different for each layer L1-Ln. The layer thicknesses of the different layers L1-Ln can be substantially the same and selected from a range of 10 μm-500 μm. In this case, a material composition can likewise be selected differently for each of the layers L1-Ln, for example in order to attain different electrostrictive properties.

In further embodiments, a sensor element 224 has such a layered construction as is shown in FIG. 9 for an actuator element 222. In this case, the use of different chemical compositions for different layers L1-Ln for example has the advantage that a comparison of the sensor signals SS of the individual layers L1-Ln can be used to draw conclusions not only regarding the mechanical stress but also regarding further influencing variables, for example the temperature in the layers L1-Ln.

Figure 10:
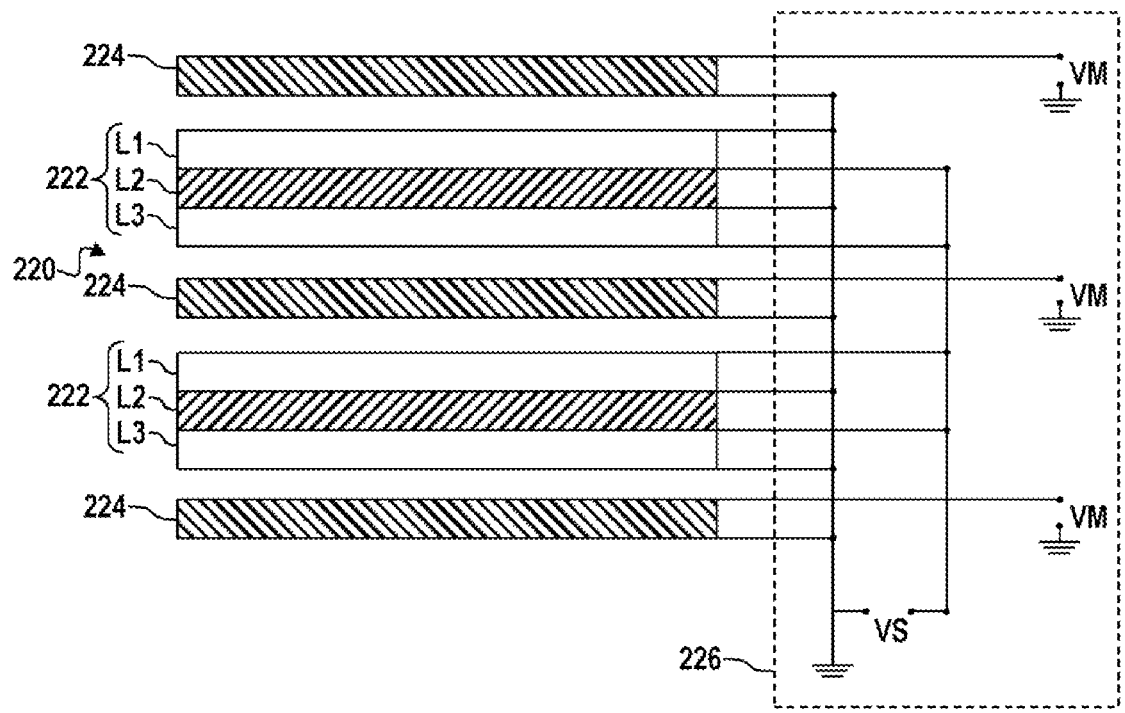
FIG. 10 shows a schematic view of an exemplary embodiment of a drive for a plurality of actuator elements and sensor elements in an actuator device.

FIG. 10 shows a schematic view of an exemplary embodiment of an actuator device 220 that comprises a plurality of actuator elements 222, a plurality of sensor elements 224 and a drive unit 226. Three sensor elements 224 and two actuator elements 222 which form a layer stack are provided in this case, wherein the actuator elements 222 each comprise, for example, three layers L1-L3 made of electrostrictive material.

Two of the sensor elements 224 enclose the entire layer stack in the manner of a sandwich, and the third sensor element 224 divides the layer stack in the middle. In the present case, passive regions are respectively arranged between the sensor elements 224 and the actuator elements 222. These can also be omitted in embodiments, wherein an electrode arranged between the sensor element 224 and actuator element 222 then constitutes a common electrode. The common electrode in this case can be grounded because the sensor element is advantageously operated without bias voltage.

The drive unit 226 here comprises a voltage source that is subject to closed-loop control for providing the drive voltage VS for the actuator elements 222 and three measurement units that are set up to generate the sensor signal SS of a respective sensor element 224 via a measurement alternating voltage VM. The measurement alternating voltages VM can have different frequencies in order to avoid mutual interference. In further specific embodiments, the multiple actuator elements 222 can also be operated with different drive voltages VS.

Figure 11:
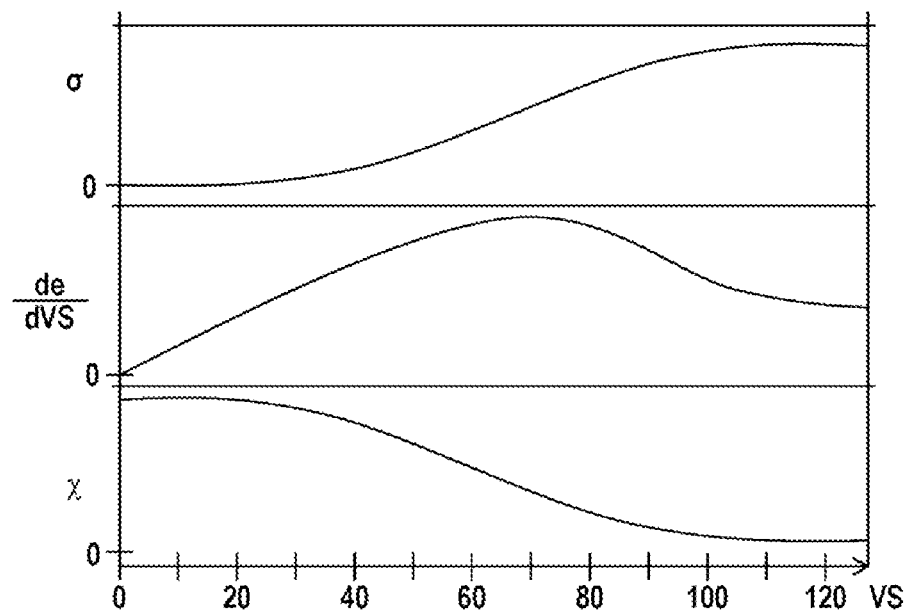
FIG. 11 shows three graphs of a behavior of physical variables as a function of a drive voltage.

FIG. 11 shows three diagrams of a behavior of physical variables, the mechanical stress a, the gradient of the deflection e achieved in relation to the drive voltage VS, ∂e/∂VS, and the dielectric susceptibility x as a function of a drive voltage VS for an exemplary electrostrictive layer, which can be used in an actuator element 222 (see FIG. 2-10 or 13) or a sensor element 224 (see FIG. 2-8, 10 or 13). The variables σ, e and χ are indicated in arbitrary units. The unit volt is selected as the scale for the drive voltage VS. The electrostrictive material is for example a material with a composition $PMN_xPt_{1-x}$. The curves shown relate to a mechanically free state of the layer, i.e. a state without mechanical prestressing and without the layer being embedded in a rigid material system.

The top diagram shows the mechanical stress σ (unit: $N/m^2$ or Pa) which is provided or produced by the layer driven with the drive voltage VS. For a drive voltage VS=0, the layer does not produce any mechanical stress σ. It can likewise be seen that a small drive voltage VS brings about only very little mechanical stress σ. In the case of low drive voltages VS, the mechanical stress σ produced is, for example, proportional to the square of the drive voltage VS.

The middle diagram shows the gradient of the deflection e achieved in relation to the drive voltage VS as a function of the drive voltage VS.

The bottom diagram shows the dielectric susceptibility x as a function of the drive voltage VS. It can be seen that the dielectric susceptibility x has a maximum at a drive voltage VS=0.

Figure 12:
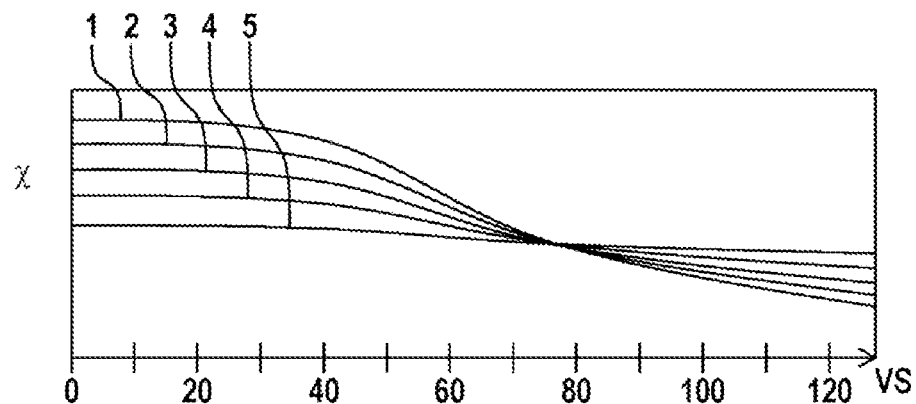
FIG. 12 is a graph showing a plurality of curves of the dielectric susceptibility as a function of a drive voltage.

As shown in FIG. 12, the dielectric susceptibility x at the drive voltage VS=0 furthermore has a very high sensitivity with regard to mechanical stress. FIG. 12 shows a diagram with a plurality of curves of the dielectric susceptibility x as a function of a drive voltage VS. The five curves 1-5 shown differ with regard to a deformation of the layer. For example, curve 3 corresponds to the mechanically free or unstressed state. Curves 1 and 2 correspond, for example, to a stretching of the layer in the ppm range, for example 10 ppm for curve 1 and 5 ppm for curve 2. Curves 4 and 5 correspond, for example, to a compression of the layer in the ppm range, for example 5 ppm for curve 4 and 10 ppm for curve 5. Due to this sensitivity maximum of the dielectric susceptibility x, this physical variable is particularly well suited as a measurement variable to determine a deformation of the layer, for example in a sensor element 224. The dielectric susceptibility x can be determined by an impedance measurement via the measurement alternating voltage VM.

Figure 13:
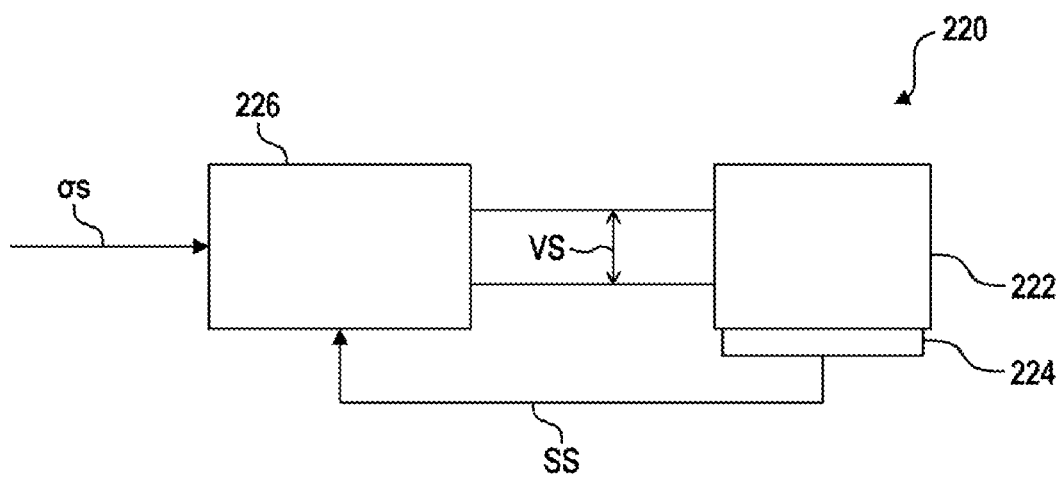
FIG. 13 shows a schematic block diagram of an exemplary embodiment of a closed-loop control circuit.

FIG. 13 shows a schematic block diagram of an exemplary embodiment of a closed-loop control circuit in an actuator device 220. In the present case, the drive unit 226 is designed as a closed-loop control unit. The closed-loop control unit 226 receives a predetermined mechanical target stress $σ_s$ from the outside, for example by way of a control computer (not shown), which the actuator device 220 is intended to provide or produce via the actuator element 222. The closed-loop control unit 226 then drives the actuator element 222 with the drive voltage VS. The drive voltage VS can be selected in such a way that, under good conditions, it exactly achieves the mechanical target stress $σ_s$, which is known, for example, from characterization measurements of the actuator element 222. However, due to hysteresis or various ambient influences, the actuator element 222 may slightly miss the target mechanical stress $σ_s$.

The sensor element 224 is deformed with the actuator element 222. The extent of the deformation can be ascertained as described above, which is represented here by the sensor signal SS. The sensor signal SS is for example characteristic of the deformation of the sensor element 224 and thus also of the mechanical stress σ achieved in the sensor element 224. Due to the direct coupling of the sensor element 222 to the actuator element 224, the mechanical stress σ in the sensor element 224 substantially corresponds to that in the actuator element 222. The sensor signal SS is therefore suitable as a closed-loop control signal. The closed-loop control unit 226 will therefore readjust the drive voltage VS for the actuator element 222 on the basis of the sensor signal SS.

A closed-loop control cycle can last for example in the range from 1 ms-100 ms, corresponding to a closed-loop control frequency of between 10 Hz-1 kHz.

FIG. 14A shows a schematic view of an EUV lithography apparatus 100A, which comprises a beam shaping and illumination system 102 and an optical system 200, which is embodied here as a projection system. In this case, EUV stands for "extreme ultraviolet" and denotes a wavelength of the working light of between 0.1 nm and 30 nm. The beam shaping and illumination system 102 and the projection system 200 are respectively provided in a vacuum housing (not shown), wherein each vacuum housing is evacuated with the aid of an evacuation apparatus (not shown). The vacuum housings are surrounded by a machine room (not shown), in which driving apparatuses for mechanically moving or setting optical elements are provided. Furthermore, electrical controllers and the like may also be provided in the machine room.

The EUV lithography apparatus 100A has an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A produced by the EUV light source 106A has a relatively low transmissivity through air, for which reason the beam guiding spaces in the beam shaping and illumination system 102 and in the projection system 200 are evacuated.

The beam shaping and illumination system 102 illustrated in FIG. 14A has five mirrors 110, 112, 114, 116, 118. After passing through the beam shaping and illumination system 102, the EUV radiation 108A is guided onto a photomask (reticle) 120. The photomask 120 is likewise designed as a reflective optical element and can be arranged outside the systems 102, 104. Furthermore, the EUV radiation 108A may be directed onto the photomask 120 via a mirror 122. The photomask 120 has a structure which is imaged onto a wafer 124 or the like in a reduced fashion via the projection system 200.

The projection system 200 (also referred to as a projection lens) has five mirrors M1 to M5 for imaging the photomask 120 onto the wafer 124. In this case, individual mirrors M1 to M5 of the projection system 200 may be arranged symmetrically in relation to an optical axis 126 of the projection system 200. It should be noted that the number of mirrors M1 to M5 of the EUV lithography apparatus 100A is not restricted to the number shown. A greater or lesser number of mirrors M1 to M5 may also be provided. Furthermore, the mirrors M1 to M5 are generally curved on their front sides for beam shaping.

The projection system 200 furthermore has a further mirror 210, on the rear side of which a multiplicity of actuator devices 220 are arranged, each of which can be designed as shown by FIG. 2-8, 10 or 13. Each actuator device 220 comprises an assigned actuator element 222 and an assigned sensor element 224. A drive unit 226 is set up to drive the actuator elements 222 with a drive voltage VS and to apply a measurement alternating voltage VM to the sensor elements 224 in order to generate a respective sensor signal SS. For the sake of clarity, only one drive unit 226 is shown here, which drives all the actuator elements 222 and sensor elements 224. The front side of the mirror 210 can be deformed by targeted driving of the actuator devices 220, which can be used to correct optical aberrations to increase the resolution of the lithography process.

In advantageous embodiments, the actuation is controlled with closed-loop control by the actuator elements 222 by virtue of the fact that an actually achieved deformation is detected by the sensor elements 224 and the drive voltage VS can therefore be controlled with closed-loop control by evaluating the sensor signal SS. This closed-loop control takes place individually for each actuator device 220, wherein only one actuator device 220 and only one drive voltage VS, one measurement alternating voltage VM and one sensor signal SS are shown for reasons of clarity.

The projection system 200, or also the beam shaping and illumination system 102, can have further mirrors 210 with an assigned actuator device 220.

FIG. 14B shows a schematic view of a DUV lithography apparatus 100B, which comprises a beam shaping and illumination system 102 and an optical system 200, which is designed here as a projection system. In this case, DUV stands for "deep ultraviolet" and denotes a wavelength of the working light of between 30 nm and 250 nm. As has already been described with reference to FIG. 14A, the beam shaping and illumination system 102 and the projection system 200 may be arranged in a vacuum housing and/or be surrounded by a machine room with corresponding driving apparatuses.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 14B guides the DUV radiation 108B onto a photomask 120. The photomask 120 is formed as a transmissive optical element and may be arranged outside the systems 102, 104. The photomask 120 has a structure which is imaged onto a wafer 124 or the like in a reduced fashion via the projection system 200.

The projection system 200 has a plurality of lens elements 128 and/or mirrors 130 for imaging the photomask 120 onto the wafer 124. In this case, individual lens elements 128 and/or mirrors 130 of the projection system 104 may be arranged symmetrically in relation to an optical axis 126 of the projection system 200. It should be noted that the number of lens elements 128 and mirrors 130 of the DUV lithography apparatus 100B is not restricted to the number shown. A greater or lesser number of lens elements 128 and/or mirrors 130 can also be provided. Furthermore, the mirrors 130 are generally curved on their front sides for beam shaping.

An air gap between the last lens element 128 and the wafer 124 can be replaced by a liquid medium 132 having a refractive index>1. The liquid medium 132 may be for example high-purity water. Such a construction is also referred to as immersion lithography and has an increased photolithographic resolution. The medium 132 can also be referred to as an immersion liquid.

The projection system 200 furthermore has a mirror 210, on the rear side of which an actuator device 220 is arranged, which can be designed as shown in FIG. 2-8, 10 or 13. Without restricting the generality, only one actuator device 220 is shown here, but it goes without saying that a multiplicity of actuator devices 220 can be present, each of which is able to be controlled individually with open-loop and/or closed-loop control. The actuator device 220 comprises an assigned actuator element 222 and an assigned sensor element 224. A drive unit 226 is set up to drive the actuator elements 222 with a drive voltage VS and to apply a measurement alternating voltage VM to the sensor elements 224 in order to generate a respective sensor signal SS.

Also shown in FIG. 14B is that a predetermined target mechanical stress $\sigma_s$ is specified from the outside, which is to be achieved by the actuator element 222. The mechanical target stress $\sigma_s$ is ascertained, for example, by a control computer on the basis of a target deformation of the mirror 210 that is to be achieved. The targeted deformation of the front side of the mirror 210 allows the correction of optical aberrations for increasing the resolution of the lithography process.

In advantageous embodiments, the actuation is controlled with closed-loop control by the actuator element 222 by virtue of the fact that an actually achieved deformation is detected by the sensor element 224 and the drive voltage VS can therefore be controlled with closed-loop control by evaluating the sensor signal SS. This closed-loop control takes place individually for each actuator device 220, wherein only one actuator device 220 and only one drive voltage VS, one measurement alternating voltage VM and one sensor signal SS are shown for reasons of clarity.

The projection system 200, or also the beam shaping and illumination system 102, can have further mirrors 210 with an assigned actuator device 220.

Figure 15:
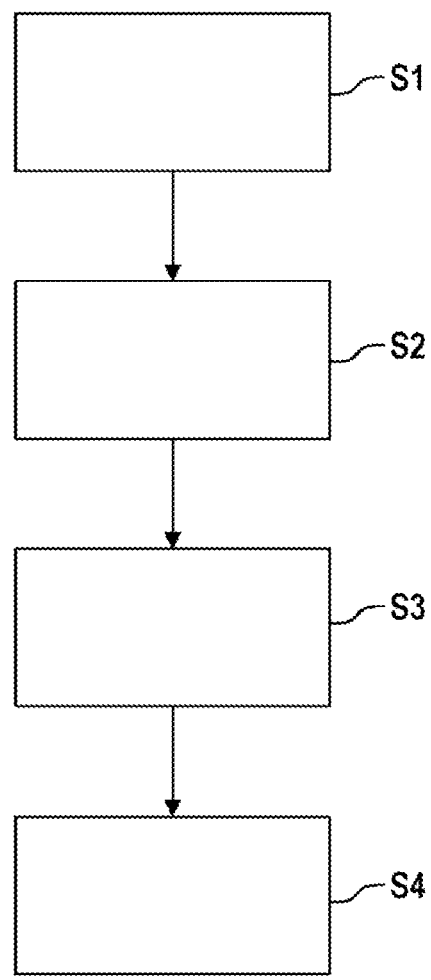
FIG. 15 shows a schematic block diagram of an exemplary embodiment of a method for correcting an aberration in an optical system.

FIG. 15 shows a schematic block diagram of an exemplary embodiment of a method for correcting an aberration in an optical system 200, for example in the optical system 200 of FIG. 1, by deforming the mirror surface 212 (see FIGS. 1-8) of a mirror 210 (see FIG. 1-8 or 14A, 14B) of the optical system 200 in a targeted manner.

In a first step S1, the at least one actuator element 222 (see FIG. 2-8 or 13) is driven via a drive voltage VS (see FIG. 2-8 or 10-13) in dependence on a specified deformation of the mirror surface 214 (see FIGS. 1-8). As a result, a mechanical stress is produced in the actuator element 222, which stress is transferred to the mirror body 212 (see FIGS. 1-8) of the mirror 210, which leads to a local deformation of the mirror surface 214.

In a second step S2, a sensor signal SS (see FIG. 2-8 or 13) is output by the at least one sensor element 224 (see FIG. 2-8 or 13). For this purpose, a measuring alternating voltage VM is applied to the sensor element 224, as has already been described above.

In a third step S3, a deformation of the sensor element 224 is ascertained in dependence on the detected sensor signal SS. An achieved deformation of the mirror surface 214 can be ascertained therefrom.

In a fourth, optional step S4, the drive voltage VS is controlled with closed-loop control in such a way that the predetermined deformation of the mirror surface 214 is achieved.

For this purpose, for example, the predetermined deformation is compared with the deformation achieved, which shows whether the drive voltage VS is desirably higher or lower in order to achieve the predetermined deformation.

Although the present disclosure has been described with reference to exemplary embodiments, it is modifiable in various ways. For example, many of the physical variables that have served to describe the description are interchangeable with other variables. Instead of mechanical stress, it is also possible to refer to force or mechanical strain or deformation. Furthermore, it can be said that the sensor signal is dependent on the dielectric susceptibility, the impedance, the polarization, the capacitance or the like, all of which can be converted into one another as long as the respective material parameters are known.

For example, the disclosure permits a large number of possible arrangements of a sensor element in relation to an actuator element in an actuator device. The different positions can be advantageous depending on the specific application. In addition, a detection accuracy can be increased by combining different arrangements in one actuator element.

Furthermore, the closed-loop control circuit for controlling the drive voltage can be implemented or realized in a variety of ways, without the present disclosure being limited in any particular way.

LIST OF REFERENCE SIGNS

1 Function curve
2 Function curve
3 Function curve
4 Function curve
5 Function curve
100A EUV lithography apparatus
100B DUV lithography apparatus
102 Beam shaping and illumination system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200 Optical system
210 Mirror
212 Mirror body
214 Mirror surface
216 Mirror carrier
220 Actuator device
221 Layer
222 Actuator element
223 Actuation direction
224 Sensor element
226 Drive unit
230 Ascertainment unit
A1 Anode
A2 Anode
A3 Anode
An Anode
K1 Cathode
K2 Cathode
K3 Cathode
Kn Cathode
L1 Layer
L2 Layer
L3 Layer
Ln Layer
LS Light source
MX Matrix
M1 Mirror
M2 Mirror
M3 Mirror
M4 Mirror
M5 Mirror
S1 Method step
S2 Method step
S3 Method step
S4 Method step
SS Sensor signal
VM Measurement alternating voltage
VS Drive voltage
$\chi$ Dielectric susceptibility
$\sigma$ Mechanical stress
$\sigma_s$ Mechanical stress

What is claimed is:

1. An optical system, comprising:
   a mirror, comprising:
      a mirror body comprising a front side and a rear side facing away from the front side; and
      a mirror surface disposed on the front side of the mirror body; and
   an actuator device comprising:
      an electrostrictive actuator element disposed on the rear side of the mirror body, the electrostrictive actuator element configured to produce mechanical stress in the mirror body to deform the mirror surface depending on an electrical drive voltage;
      an electrostrictive sensor element configured to output a sensor signal depending on a deformation of the electrostrictive sensor element,
   wherein:
      the electrostrictive actuator comprises a first electrode, a second electrode and an electrostrictive material; and
      each of the first electrode, the second electrode and the electrostrictive material is arranged on the same side of the mirror body; and
   wherein at least one of the following holds:
      i) the electrostrictive sensor element directly adjoins the electrostrictive actuator element;
      ii) the electrostrictive sensor element is supported by the rear side of the mirror body and is separated from the mirror body by at least the electrostrictive actuator element; and
      iii) the electrostrictive sensor element is configured to at least partially transfer the mechanical stress produced by the electrostrictive actuator element to the mirror body.

2. The optical system of claim 1, further comprising a closed-loop control unit configured to control the drive voltage depending on the sensor signal so that a predetermined mechanical stress in the mirror body is achieved.

3. The optical system of claim 2, wherein the actuator device comprises an assignment unit configured to assign a value of the output sensor signal to an achieved deformation of the mirror surface based on a calibration measurement, and the closed-loop control unit is configured to control the drive voltage depending on the assigned value and a predetermined deformation of the mirror surface.

4. The optical system of claim 1, wherein the electrostrictive actuator element and the electrostrictive sensor element define a monolithic element.

5. The optical system of claim 1, wherein, in a direction along a surface normal of the mirror surface, the electrostrictive sensor element is at least partially between the electrostrictive actuator element and the mirror body.

6. The optical system of claim 1, wherein the electrostrictive actuator element and the electrostrictive sensor element each comprises a layer comprising electrostrictive material.

7. The optical system of claim 6, wherein the electrostrictive actuator element comprises a plurality of layers comprising electrostrictive material, each layer comprises an assigned cathode and an assigned anode, and each layer is drivable with a respective drive voltage.

8. The optical system of claim 6, wherein the electrostrictive actuator element and the electrostrictive sensor element define a layer stack comprising at least two layers.

9. The optical system of claim 1, wherein:
the actuator device comprises at least two electrostrictive sensor elements;
material compositions of the at least two electrostrictive sensor elements differ from each other; and
each of the at least two electrostrictive sensor elements is configured to output a sensor signal.

10. The optical system of claim 9, further comprising an ascertainment unit configured to ascertain a temperature in the mirror body depending on the sensor signals output by the at least two electrostrictive sensor elements.

11. The optical system of claim 9, further comprising a measurement unit configured to apply a measurement alternating voltage to the at least two electrostrictive sensor elements to generate the sensor signals output by the electrorestrictive sensor elements, wherein a frequency of the measurement alternating voltage is different for each of the at least two electrostrictive sensor elements.

12. The optical system of claim 1, wherein:
the actuator device comprises a plurality of M electrostrictive actuator elements;
the actuator device comprises a plurality of N electrorestrictive sensor elements;
M is an integer;
N is an integer; and
the electrostrictive actuator elements and the electrostrictive sensor elements are disposed in alternation.

13. The optical system of claim 1, comprising a plurality of individually controllable actuator devices supported by the mirror.

14. An apparatus, comprising:
an optical system according to claim 1,
wherein the apparatus is a lithography apparatus.

15. The apparatus of claim 14, comprising:
an illumination system; and
a projection system.

16. The apparatus of claim 15, wherein the projection system comprises the optical system.

17. A method, comprising:
providing an optical system according to claim 1;
using the optical system to deform the mirror surface.

18. The optical system of claim 1, wherein the electrostrictive sensor element is disposed on the rear side of the mirror body.

19. The optical system of claim 1, wherein the electrostrictive actuator element is mechanically coupled to the rear side of the mirror body.

20. The optical system of claim 1, wherein the electrostrictive sensor element is mechanically coupled to the actuator element.

21. The optical system of claim 1, wherein the electrostrictive sensor element is mechanically coupled to the rear side of the mirror body.

22. The optical system of claim 1, wherein the electrostrictive actuator element comprises a piezoelectric material.

23. The optical system of claim 1, wherein the electrostrictive actuator element is entirely disposed on the rear face of the mirror body.

24. The optical system of claim 1, wherein the first electrode is between the mirror body and the electrostrictive material.

25. The optical system of claim 1, wherein the electrostrictive material is different from the mirror body.

26. The optical system of claim 1, wherein:
the actuator device comprises a mirror carrier; and
each of the first electrode, the second electrode, and the electrostrictive material is between the mirror body and the mirror carrier.

27. The optical system of claim 1, wherein the mirror body and the electrostrictive material are separate components.

28. The optical system of claim 1, wherein the mirror body and the actuator device are separate components.

29. A method of operating an optical system comprising a mirror which comprises a mirror body and a mirror surface, the mirror body comprising a front side and a rear side opposite facing away from the front side, the mirror surface being disposed on the front side of the mirror body, the optical system further comprising an actuator device, the method comprising:
driving an electrostrictive actuator element of the actuator device with an electrical drive voltage so that a mechanical stress is produced in the mirror body and the mirror surface deforms, the electrostrictive actuator element being disposed on the rear side of the mirror body;
using an electrorestrictive sensor element of the actuator device to detect a sensor signal depending on a deformation of the electrostrictive sensor element; and
determining the deformation of the mirror surface depending on the detected sensor signal,
wherein:
the electrostrictive actuator comprises a first electrode, a second electrode and an electrostrictive material; and
each of the first electrode, the second electrode and the electrostrictive material is arranged on the same side of the mirror body; and
wherein at least one of the following holds:
i) the electrostrictive sensor element directly adjoins the electrostrictive actuator element;
ii) the electrostrictive sensor element is supported by the rear side of the mirror body away from the mirror surface and is separated from the mirror body by at least the electrostrictive actuator element; and
iii) the electrostrictive sensor element is configured to at least partially transfer the mechanical stress produced by the electrostrictive actuator element to the mirror body.

30. The method of claim 29, wherein a lithography apparatus comprises the optical system.

31. The method of claim 30, wherein the lithography apparatus comprises a projection objective, and the projection objective comprises the optical system.

* * * * *

UNITED STATES PATENT AND TRADEMARK OFFICE
CERTIFICATE OF CORRECTION

PATENT NO. : 12,130,557 B2
APPLICATION NO. : 17/885353
DATED : October 29, 2024
INVENTOR(S) : Matthias Manger and Markus Raab It is certified that error appears in the above-identified patent and that said Letters Patent is hereby corrected as shown below:

In the Drawings

Sheet 5 of 9, Fig. 11, Line 1, y-axis, delete "de/dVS" and insert -- $\partial e/\partial VS$ --.

Sheet 6 of 9, Fig. 13, Line 3, delete "σs" and insert -- $\sigma_s$ --.

In the Specification

Column 1, Line 16, delete "TO" and insert -- to --.

Column 7, Line 20, delete "dell) formations" and insert -- deformations --.

Column 7, Line 49, delete "can deformed" and insert -- can be deformed --.

Column 8, Line 51, delete "over-determination," and insert -- overdetermination, --.

Column 12, Line 24, delete "FIG." and insert -- FIGS. --.

Column 13, Line 66, delete "FIG." and insert -- FIGS. --.

Column 15, Line 5, delete "a," and insert -- $\sigma$, --.

Column 15, Line 7, delete "x" and insert -- $\chi$ --.

Column 15, Line 9, delete "FIG." and insert -- FIGS. --.

Column 15, Line 10, delete "FIG." and insert -- FIGS. --.

Column 15, Line 30, delete "x" and insert -- $\chi$ --.

Signed and Sealed this
Sixth Day of May, 2025

Coke Morgan Stewart
*Acting Director of the United States Patent and Trademark Office*

CERTIFICATE OF CORRECTION (continued)
U.S. Pat. No. 12,130,557 B2

Column 15, Line 32, delete "x" and insert -- $\chi$ --.

Column 15, Line 37, delete "x" and insert -- $\chi$ --.

Column 15, Line 46, delete "x," and insert -- $\chi$, --.

Column 15, Line 50, delete "x" and insert -- $\chi$ --.

Column 17, Line 4, delete "FIG." and insert -- FIGS. --.

Column 18, Line 5, delete "FIG." and insert -- FIGS. --.

Column 18, Line 43, delete "FIG." and insert -- FIGS. --.

Column 18, Line 46, delete "FIG." and insert -- FIGS. --.

Column 18, Line 46, delete "FIG." and insert -- FIGS. --.

Column 18, Line 53, delete "FIG." and insert -- FIGS. --.

Column 18, Line 54, delete "FIG." and insert -- FIGS. --.